United States Patent [19]
Sun et al.

[11] Patent Number: 5,548,243
[45] Date of Patent: Aug. 20, 1996

[54] DEMODULATOR FOR DEMODULATING A SINGLE SIDE BAND SIGNAL, A REAL ZERO SINGLE SIDE BAND SIGNAL AND A FREQUENCY MODULATED SIGNAL, AND A CARRIER SIGNAL REPRODUCING CIRCUIT FOR THE DEMODULATOR

[75] Inventors: Weimin Sun, Ikoma-Gun; Shigeki Kajimoto, Sakai, both of Japan

[73] Assignee: Icom Incorporated, Osaka, Japan

[21] Appl. No.: 480,095

[22] Filed: Jun. 7, 1995

[30] Foreign Application Priority Data

Feb. 21, 1995 [JP] Japan .................................. 7-032059

[51] Int. Cl.$^6$ .............................. H03D 3/00; H03D 5/00; H03D 1/00
[52] U.S. Cl. .......................... 329/316; 329/317; 329/325; 329/327; 329/357; 329/360; 329/363; 455/142; 455/203; 455/208; 455/214; 455/263; 455/337
[58] Field of Search .......................... 329/316, 317, 329/323–327, 347, 357, 358, 360, 363; 455/47, 142, 144, 203, 204, 208, 214, 260, 263, 337

[56] References Cited

U.S. PATENT DOCUMENTS

| | | | |
|---|---|---|---|
| 3,873,931 | 3/1975 | Basse et al. | 329/325 X |
| 4,466,128 | 8/1984 | Couvillon | 329/326 X |
| 4,837,853 | 6/1989 | Heck | 329/325 X |
| 5,034,695 | 7/1991 | Owen | 329/325 |
| 5,408,196 | 4/1995 | Sempel et al. | 329/325 |

*Primary Examiner*—David Mis
*Attorney, Agent, or Firm*—Frishauf, Holtz, Goodman, Langer & Chick

[57] ABSTRACT

A demodulator receives a radio signal and causes a carrier signal reproducing circuit to reproduce the carrier signal of the received signal. One amplifier amplifies the amplitude of the reproduced carrier signal by K, and another amplifies the amplitude of the reproduced carrier signal by (K+2). An adder adds the reproduced carrier signal, amplified by K, and the received signal. A subtracter subtracts the received signal from the reproduced carrier signal amplified by (K+2). The output signal of the adder is demodulated by a first FM demodulator and the output signal of the subtracter is demodulated by a second FM demodulator. Another subtracter outputs the difference between the demodulated signals from the first and second FM demodulators as a demodulated signal of the received signal.

27 Claims, 9 Drawing Sheets

AN OUTPUT SIGNAL OF THE CONVENTIONAL RZSSB DEMODULATOR WITH A LINEARIZER

FIG. 7

AN OUTPUT SIGNAL OF THE DEMODULATOR OF THE EMBODIMENT

FIG. 8

AN OUTPUT SIGNAL OF THE CONVENTIONAL RZSSB DEMODULATOR WITH A LINEARIZER

FIG. 9 AN OUTPUT SIGNAL OF THE DEMODULATOR OF THE EMBODIMENT

DEMODULATOR FOR DEMODULATING A SINGLE SIDE BAND SIGNAL, A REAL ZERO SINGLE SIDE BAND SIGNAL AND A FREQUENCY MODULATED SIGNAL, AND A CARRIER SIGNAL REPRODUCING CIRCUIT FOR THE DEMODULATOR

BACKGROUND OF THE INVENTION

1. Field of the Invention

The present invention relates to a demodulator for radio communication, and, more particularly, to a demodulator capable of demodulating any of a full carrier SSB (Single Side Band) signal, a reduced carrier SSB signal, an RZSSB signal, and an FM signal, and a carrier signal reproducing circuit used in the demodulator.

2. Description of the Related Art

In mobile communication or the like, an RZSSB (Real Zero Single Side Band) system has been proposed as a radio communication system with an excellent frequency usage and excellent fading characteristics.

Figure 4:
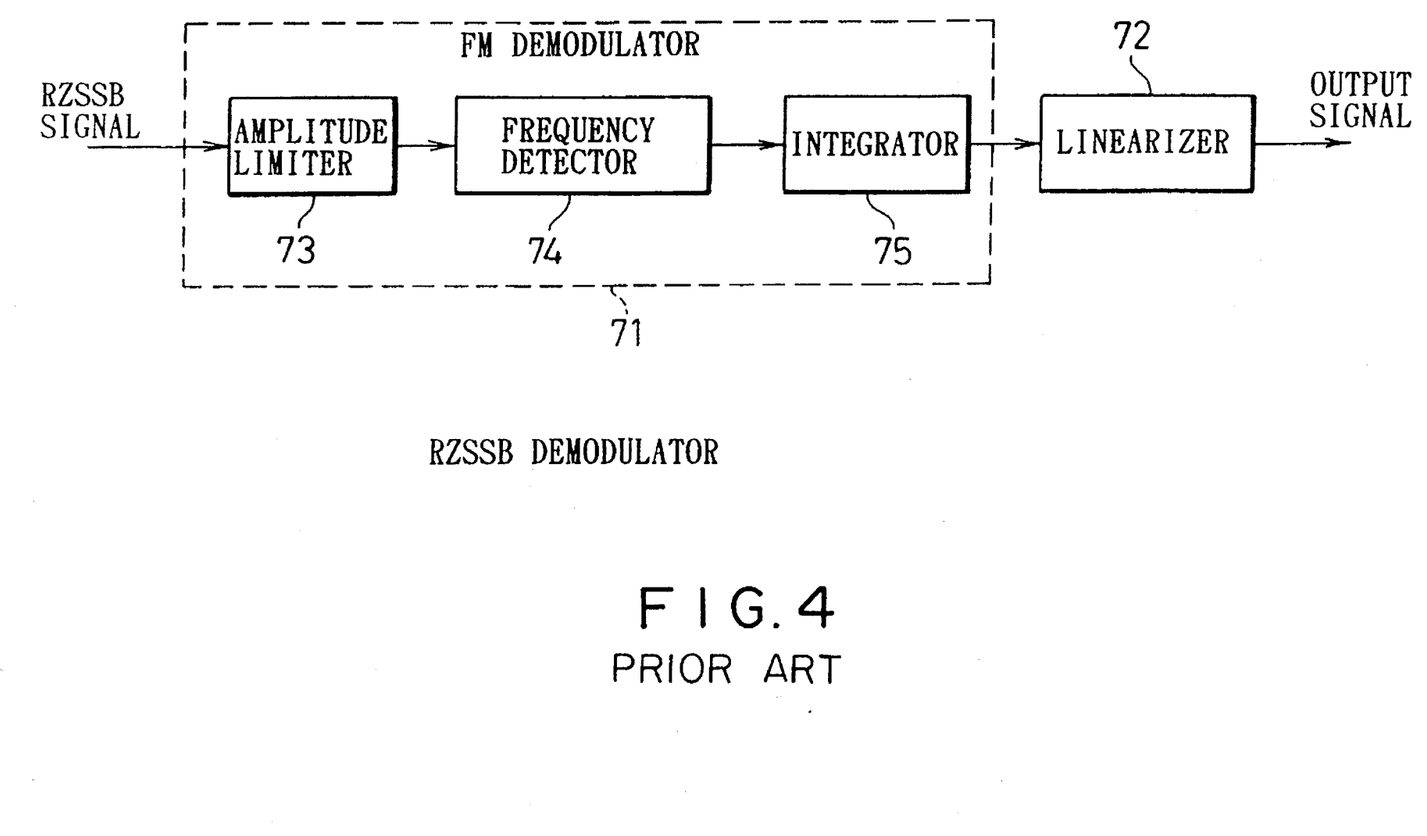
FIG. 4 is a circuit block diagram of a conventional demodulator for an RZSSB signal.

A conventional demodulator for demodulating an RZSSB signal comprises: an FM demodulator 71, which includes an amplitude limiter 73, a frequency detector 74 and an integrator 75; and a linearizer 72, as shown in FIG. 4. The linearizer 72 comprises a Hilbert transform circuit 81, a delay circuit 82, mixers 83 and 84, a cuber 85, amplifiers 86 to 88, and an adder 89, as shown in FIG. 5, for example.

The FM demodulator 71 demodulates an incoming RZSSB signal, and the linearizer 72 eliminates the high-order distortion of the demodulated signal included in a demodulated signal.

Figure 5:
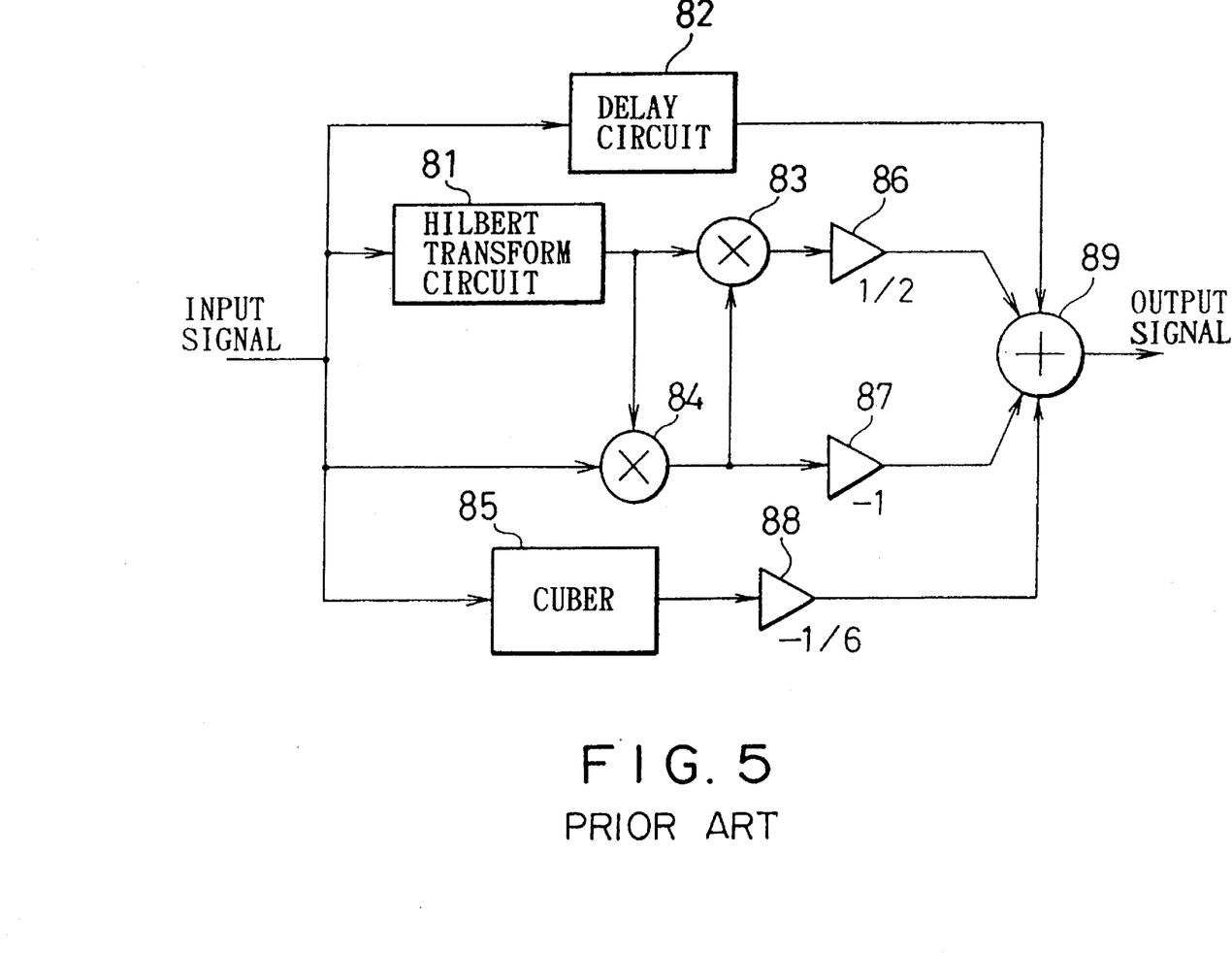
FIG. 5 is a circuit block diagram exemplifying the structure of a linearizer of the conventional demodulator shown in FIG. 4.

The conventional RZSSB demodulator requires the linearizer 72 to eliminate the high-order distortions, as shown in FIG. 4, and this linearizer 72 should include the Hilbert transform circuit as shown in FIG. 5.

The Hilbert transform circuit demands the complicated circuit design and is difficult to manufacture. Further, while the characteristics of the Hilbert transform circuit greatly affect the quality of the demodulated signal, it is difficult to design and manufacture a Hilbert transform circuit having excellent characteristics.

Although the distortion of third order or greater can be reduced to a negligible level without using the linearizer 72 if the modulation index of the RZSSB signal is set small, the demodulation efficiency is impaired.

As mentioned above, the conventional RZSSB demodulator can eliminate the distortions of the RZSSB signal using the linearizer 72. When an FM signal is to be received, however, the demodulated signal contains no distortion so that the linearizer 72 produces distortions in the demodulated signal by contraries. Therefore, the conventional RZSSB demodulator cannot demodulate an FM signal, so that the demodulation of both the SSB signal and FM signal requires separate demodulators designed specifically for those signals.

SUMMARY OF THE INVENTION

Accordingly, it is an object of the present invention to provide a demodulator capable of demodulating an RZSSB signal with low distortion without using a linearizer.

It is another object of this invention to provide a demodulator capable of demodulating both an RZSSB signal and an FM signal.

To achieve the above objects, a demodulator according to one aspect of this invention comprises:

a receiver circuit for receiving a radio signal;

a carrier signal reproducing circuit for reproducing a carrier signal from the received signal of the receiver circuit;

a first amplifier for amplifying the carrier signal, reproduced by the carrier signal reproducing circuit, only by a first value to produce a first reproduced carrier signal;

a second amplifier for amplifying the carrier signal, reproduced by the carrier signal reproducing circuit, only by a second value to produce a second reproduced carrier signal;

an adder for adding the first reproduced carrier signal and the received signal from the receiver circuit;

a subtracter for obtaining a difference between the second reproduced carrier signal and the received signal from the receiver circuit;

a first FM demodulator for demodulating an output signal of the adder;

a second FM demodulator for demodulating an output signal of the subtracter; and an arithmetic operation circuit for performing an operation on an output signal of the first FM demodulator and an output signal of the second FM demodulator to produce a demodulated signal of the received signal, and outputting the demodulated signal.

For example, the first value is $20\log_{10}(K)$ dB, and the second value is $20\log_{10}(K+2)$ dB, where K is a positive integer.

To achieve the above objects, a demodulator according to a second aspect of this invention comprises:

an adder for adding a reproduced carrier signal having an amplitude multiplied by K and an SSB signal having a carrier signal;

a subtracter for obtaining a difference between a reproduced carrier signal having an amplitude multiplied by (K+2) and the SSB signal having the carrier signal;

a first FM demodulator for demodulating an output signal of the adder;

a second FM demodulator for demodulating an output signal of the subtracter; and an arithmetic operation circuit for performing an operation on an output signal of the first FM demodulator and an output signal of the second FM demodulator to produce a demodulated signal of the SSB signal, and outputting the demodulated signal.

A carrier signal reproducing circuit according to a third aspect of this invention comprises:

a bandpass filter for filtering a received signal mixed with a local signal and outputting a component of a predetermined frequency as a reproduced carrier signal;

an FM detector for performing FM detection on an output signal of the bandpass filter; and a frequency controller for controlling a frequency of the local signal in accordance with an output signal of the FM detector.

The demodulators according to the first and second aspects of this invention can demodulate an RZSSB signal with low distortion. Their structures do not require a circuit like a linearizer (Hilbert transform circuit) which is complex and difficult to be designed and manufactured, so that those demodulators can be designed and manufactured easily.

Further, the demodulators according to the first and second aspects of this invention each can demodulate any one of a full carrier SSB signal, a reduced carrier SSB signal and RZSSB signal and an FM signal.

The carrier signal reproducing circuit according to the third aspect of this invention can accurately reproduce the carrier signal of the received signal.

DETAILED DESCRIPTION OF THE PREFERRED EMBODIMENT

A demodulator according to one embodiment of the present invention will be described below with reference to the accompanying drawings.

Figure 1:
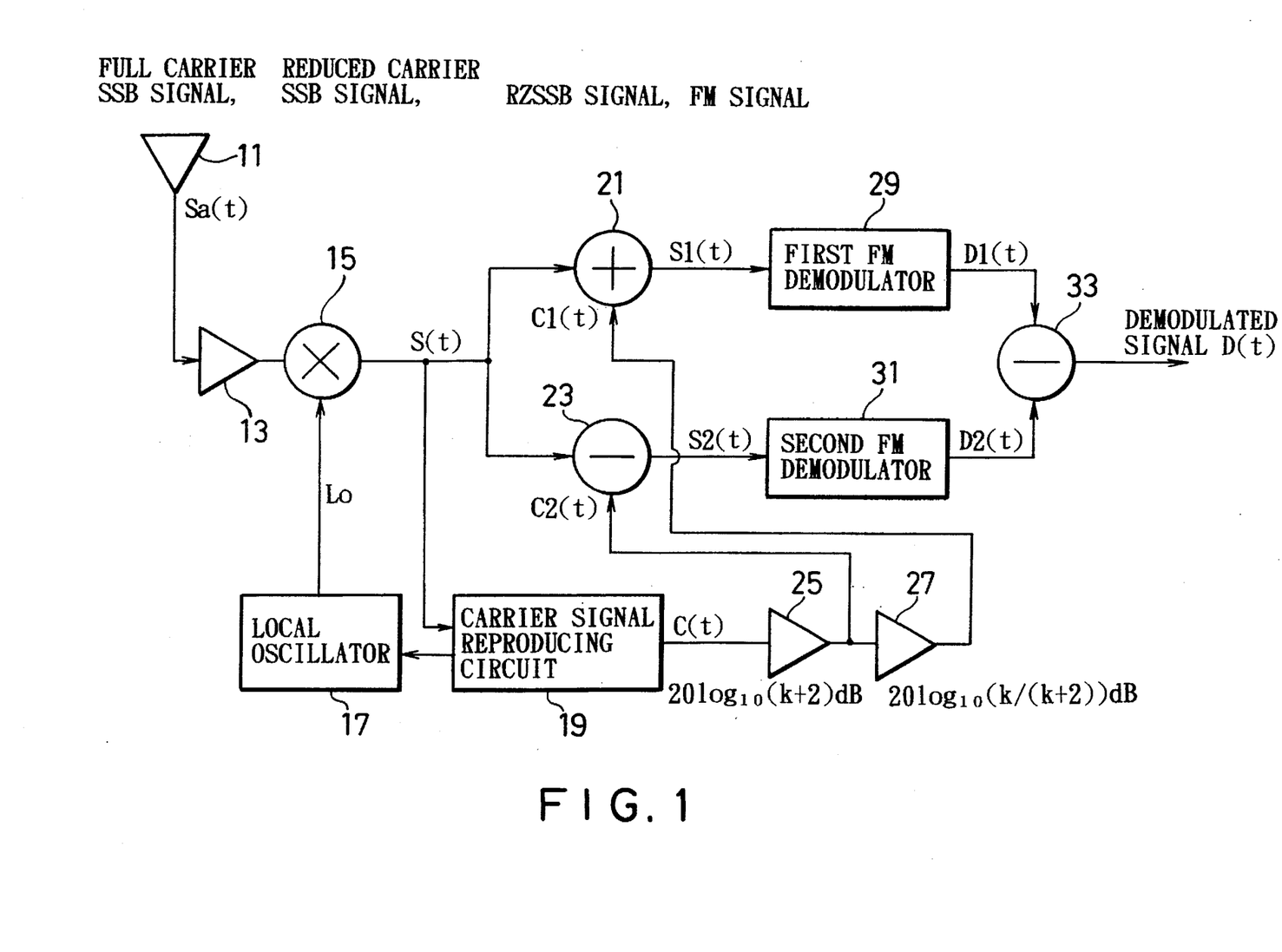
FIG. 1 is a circuit diagram of a demodulator according to one embodiment of the present invention.

FIG. 1 is a circuit block diagram of a demodulator according to this embodiment.

In FIG. 1, a signal Sa(t) from an antenna 11 is amplified by an amplifier 13, and is mixed with a local oscillator signal Lo from a local oscillator 17, by a mixer 15. The obtained signal is an intermediate frequency signal S(t).

The antenna 11, amplifier 13, mixer 15 and local oscillator 17 constitute a receiver circuit. The intermediate frequency signal (received signal) S(t) from the receiver circuit is supplied to a carrier signal reproducing circuit 19, an analog adder 21 and an analog subtracter 23.

The carrier signal reproducing circuit 19 reproduces a carrier signal C(t) from the intermediate frequency signal S(t) from the mixer 15, and controls the frequency of the local oscillator signal Lo from the local oscillator 17.

The carrier signal C(t) reproduced by the carrier signal reproducing circuit 19 is amplified by $20\log_{10}(K+2)$ (dB) by an amplifier 25 (K: any positive integer), and is further amplified by $20\log_{10}(K/(K+2))$ (dB) by an amplifier 27 (which is functionally an attenuator). Therefore, a first reproduced carrier signal C1(t) from the amplifier 27 has the same amplitude as that of a signal obtained by amplifying the carrier signal C(t), reproduced by the carrier signal reproducing circuit 19, by $20\log_{10}K$ (dB).

The reproduced carrier signal C(t) amplified by the amplifier 25 is output as a second reproduced carrier signal C2(t).

The adder 21 adds the first reproduced carrier signal C1(t) from the amplifier 27 and the intermediate frequency signal S(t) from the mixer 15, and outputs the obtained signal as a signal S1(t).

The subtracter 23 subtracts the intermediate frequency signal S(t) from the second reproduced carrier signal C2(t), and outputs the obtained signal as a signal S2(t).

The output signal S1(t) of the adder 21 is supplied to a first FM demodulator 29 to be demodulated.

The output signal S2(t) of the subtracter 23 is supplied to a second FM demodulator 31 to be demodulated.

Each of the first FM demodulator 29 and the second FM demodulator 31, like the conventional FM demodulator 71, comprises an amplitude limiter, a frequency detector and an integrator. The output signal (audio frequency signal), D1(t), of the first FM demodulator 29 and the output signal, D2(t), of the second FM demodulator 31 are supplied to an analog subtracter 33. The subtracter 33 obtains the difference between the output signal D1(t) of the first FM demodulator 29 and the output signal D2(t) of the second FM demodulator 31 to produce a demodulated signal D(t).

The operation of the demodulator shown in FIG. 1 will now be described.

In receiving an SSB signal, the signal from the antenna 11 can be expressed by an equation 1.

$$Sa(t)=(n+m \cdot g(t)) \cdot \cos(\omega_c \cdot t) + m \cdot g\#(t) \cdot \sin(\omega_c \cdot t) \quad (1)$$

where n and m are positive real numbers, and m/n is a modulation index.

The input signal Sa(t) is an RZSSB signal when n>m, is a full carrier SSB signal when n=m, and is a reduced carrier SSB signal when n<m. g(t) is the target signal and g#(t) is the signal obtained from Hilbert transform of the target signal g(t).

The frequency of the local oscillator signal Lo from the local oscillator 17 is the sum, fo+ε, of a reference frequency fo and an unknown error ε. Given that the frequency of the reproduced carrier signal is fc and the frequency of the target signal is fa, then fc=fa−fo.

The mixer 15 mixes the input signal Sa(t), expressed by the equation 1, with the local oscillator signal Lo of frequency fo and outputs the intermediate frequency signal S(t) given by an equation 2.

$$S(t)=(n+m \cdot g(t)) \cdot \cos(\omega_c \cdot t=\theta)$$
$$+m \cdot g\#(t) \cdot \sin(\omega_c \cdot t=\theta) \quad (2)$$

The carrier signal reproducing circuit 19 reproduces the carrier signal C(t) from the intermediate frequency signal S(t). The reproduced carrier signal C(t) can be given by an equation 3.

$$C(t) = n \cdot \cos(\omega_c \cdot t) \quad (3)$$

The amplifier 25 amplifies the reproduced carrier signal C(t) by $20\log_{10}(K+2)$ (dB) and outputs the obtained signal as the second reproduced carrier signal C2(t), and the amplifier 27 amplifies the second reproduced carrier signal C2(t) by $20\log_{10}K/(K+2)$ (dB) and outputs the obtained signal as the first reproduced carrier signal C1(t). The first reproduced carrier signal C1(t) from the amplifier 27 can be given by an equation 4, and the second reproduced carrier signal C2(t) amplified by the amplifier 25 can be given by an equation 5.

$$C1(t) = K \cdot n \cdot \cos(\omega_c \cdot t) \quad (4)$$

$$C2(t) = (K+2) \cdot n \cdot \cos(\omega_c \cdot t) \quad (5)$$

The adder 21 adds the first reproduced carrier signal C1(t) from the amplifier 27 and the intermediate frequency signal S(t) from the mixer 15. Therefore, the output signal of the adder 21 is given by an equation 6. This signal S1(t) is an RZSSB signal.

The subtracter 23 subtracts the intermediate frequency signal S(t) from the second reproduced carrier signal C2(t). Thus, the output signal of the subtracter 23 is given by an equation 7. This signal S2(t) is equivalent to an unwanted side band signal of the RZSSB signal.

$$\begin{aligned} S1(t) &= C1(t) + S(t) \\ &= K \cdot n \cdot \cos(\omega_c \cdot t + \theta) + S(t) \end{aligned} \quad (6)$$

$$\begin{aligned} S2(t) &= C2(t) - S(t) \\ &= (k+2) \cdot n \cdot \cos(\omega_c \cdot t + \theta) - S(t) \end{aligned} \quad (7)$$

The first FM demodulator 29 demodulates the input signal S1(t). The output signal D1(t) of the first FM demodulator 29 is expressed by an equation 8 where $0((m/(n \cdot K))^4)$ is the sum of distortions of the fourth or greater order.

The second FM demodulator 31 demodulates the input signal S2(t). The output signal D2(t) of the second FM demodulator 31 is expressed by an equation 9.

$$\begin{aligned} D1(t) = \ & (m/(n \cdot K)) \, g^\#(t) - (m/(n \cdot K))^2 g^\#(t) g(t) - \\ & (m/(n \cdot K))^3 \{ g^{\#3}(t)/3 - g^{\#2}(t) g(t) \} + \\ & O((m/(n \cdot K))^2) \end{aligned} \quad (8)$$

$$\begin{aligned} D2(t) = \ & -(m/(n \cdot K)) g^\#(t) - (m/(n \cdot K))^2 g^\#(t) g(t) + \\ & (m/(n \cdot K))^3 \{ g^{\#3}(t)/3 - g^{\#2}(t) g(t) \} + \\ & O((m/(n \cdot K))^4) \end{aligned} \quad (9)$$

The subtracter 33 obtains the difference between the output signals D1(t) and D2(t) of the first and second FM demodulators 29 and 31, and outputs the obtained signal as the demodulated signal D(t). This demodulated signal D(t) can be given by an equation 10. It is apparent from the equation 10 that the target signal g(t) has been demodulated.

$$\begin{aligned} D(t) &= D1(t) - D2(t) \\ &= 2 \cdot (m/(n \cdot K)) g^\#(t) - \\ & 2 \cdot (m/(n \cdot K))^3 \{ g^{\#3}(t)/3 - g^{\#2}(t) g(t) \} + \\ & O((m/(n \cdot K))^5) \end{aligned} \quad (10)$$

where $0((m/(n \cdot K))^5)$ is the sum of distortions of the fifth or greater order.

Assume that K=3, n=m and the received signal is a full carrier SSB signal (the target signal has a single tone). Then, the level of the second-order distortion of the demodulated signal is about −60 dB of the level of the target signal, and the level of the third-order distortion is −34 dB thereof. The level of the distortions is therefore significantly smaller than the level of the target signal g(t). That is, the obtained demodulated signal has no (less) distortion.

According to this embodiment, as described above, the adder 21 and the subtracter 23 invert the phase of the intermediate frequency signal S(t) from the mixer 15, and this signal is subtracted by the subtracter 33, thereby eliminating even-numbered order distortions of the demodulated signal.

As the reproduced carrier signal C(t) is amplified by the amplifiers 25 and 27, odd-numbered order distortions (particularly, the third-order distortion) can be suppressed, so that the demodulated signal of an RZSSB signal with less distortion can be obtained. This embodiment can therefore permit the reception of SSB signals including an RZSSB signal with a simple structure requiring no linearizer.

When the received signal is an FM signal, unlike in the case of the demodulation of an RZSSB signal, no distortion is present in the output signals D1(t) and D2(t) of the first and second FM demodulators 29 and 31, nor in the demodulated signal D(t) from the subtracter 33.

Although the amplification of the reproduced carrier signal C(t) by the amplifiers 25 and 27 influences the modulation factor of an FM signal, it does not particularly affect the demodulation.

In short, the demodulator of this embodiment can demodulate an RZSSB signal with much less high-order distortion without using a linearizer. As no linearizer is used, an FM signal can be demodulated without distortion. In other words, it is possible to demodulate any one of a full carrier SSB signal, a reduced carrier SSB signal, an RZSSB signal, and an FM signal.

One example of the structures of the local oscillator 17 and the carrier signal reproducing circuit 19 will be explained below referring to FIG. 2.

The local oscillator 17 is constituted of a PLL (Phase Locked Loop) circuit, which alters the frequency of the local oscillator signal Lo by controlling the frequency-division ratio or the like in accordance with a frequency control signal from the carrier signal reproducing circuit 19.

The carrier signal reproducing circuit 19 comprises a bandpass filter 41 of a narrow band, an FM detector 42, a low-pass filter (LPF) 43 and a frequency controller 44. The bandpass filter 41 passes a component of a predetermined frequency band of the intermediate frequency signal S(t) from the mixer 15. The FM detector 42 performs FM detection on the output signal (passed signal component) of the bandpass filter 41. The LPF 43 passes the low-frequency component of the output signal of the FM detector 42. In accordance with the output signal (passed signal component) of the LPF 43, the frequency controller 44 outputs the frequency control signal for controlling the frequency-division ratio of the PLL circuit which constitutes the local oscillator 17.

Suppose that fo+ε is the frequency of the local oscillator signal Lo where ε is an unknown error, and fc is the frequency of the carrier signal and the center frequency of the bandpass filter 41. Given that fa is the frequency of the target signal, then fc=fa−fo is satisfied. The zero phase point of the bandpass filter 41 is set to the center frequency fc of the passband.

Figure 2:
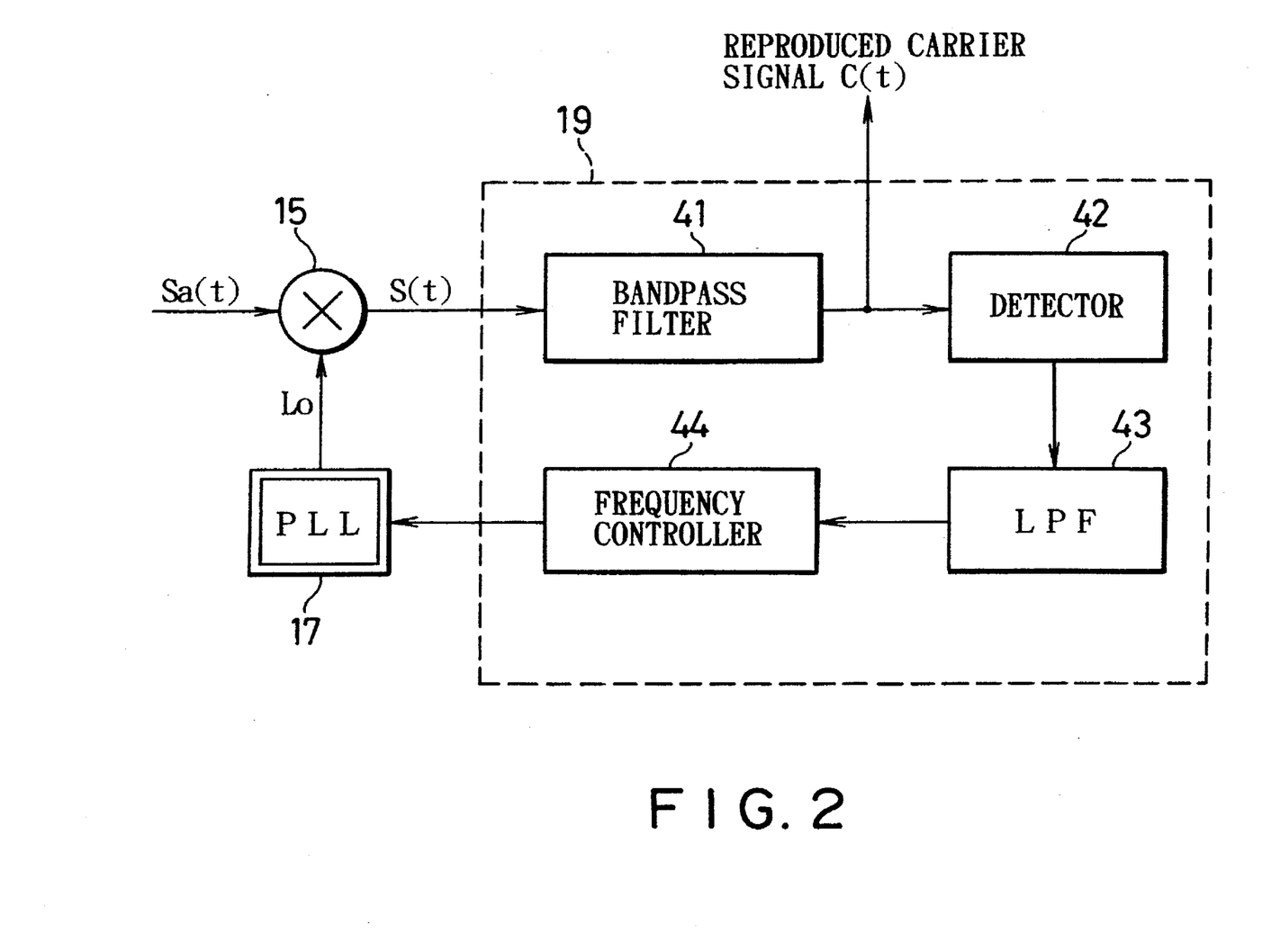
FIG. 2 is a circuit block diagram showing one example of the structure of a carrier signal reproducing circuit shown in FIG. 1.

With the structure in FIG. 2, the output signal of the bandpass filter 41 is output as the reproduced carrier signal C(t) and is demodulated in the FM detector 42. The high-frequency component of the output signal of the FM detector 42 is supplied via the LPF 43 to the frequency controller 44. The frequency controller 44 controls the frequency-division ratio or the like of the PLL circuit, which constitutes the local oscillator 17, to adjust the frequency of the local oscillator signal Lo in such a way that the level of the output signal of the LPF 43 or the level of the demodulated signal after the elimination of its high-frequency component like noise becomes substantially 0.

When the level of the output signal of the LPF 43 becomes 0, the error $\epsilon$ becomes 0, the zero phase point of the bandpass filter 41 matches with the frequency fc of the carrier signal, and the reproduced carrier signal C(t) matches in frequency and phase with the carrier signal of the intermediate frequency signal S(t).

Another example of the local oscillator 17 and the carrier signal reproducing circuit 19 designed using the DDS (Direct Digital Synthesis) technique will now be discussed with reference to FIG. 3.

The local oscillator 17 comprises a digital oscillator 51, which outputs a digital oscillation signal, a digital-to-analog converter (DAC) 52 for converting the output signal of the digital oscillator 51 to an analog signal, and a LPF 53, which cuts the high-frequency component of the output signal of the DAC 52 and supplies the obtained signal as the local oscillator signal Lo to the mixer 15.

The carrier signal reproducing circuit 19 comprises an analog-to-digital converter (ADC) 61, a digital bandpass filter 62 of a narrow band, a DAC 63, an analog LPF 64, an FM digital detector 65, a digital LPF 66, a bandwidth controller 67, and a level converter 68. The ADC 61 samples the intermediate frequency signal S(t) from the mixer 15 at a predetermined sampling frequency fs to convert the signal to digital data. The digital bandpass filter 62 filters the digital signal from the ADC 61. The DAC 63 converts the output signal Sf(t) of the digital bandpass filter 62 to an analog signal. The analog LPF 64 cuts the high-frequency component of the output signal of the DAC 63 and outputs the obtained signal as the reproduced carrier signal C(t). The FM digital detector 65 performs frequency detection on the output signal Sf(t) of the digital bandpass filter 62. The digital LPF 66 filters the output signal Sfm(t) of the FM digital detector 65. The bandwidth controller 67 controls the passband width of the digital bandpass filter 62 of a narrow band in accordance with the output signal of the digital LPF 66. The level converter 68 converts the level indicated by the output signal (data) of the digital LPF 66 and supplies the obtained signal as frequency control data to the digital oscillator 51.

The center frequency fc of the digital bandpass filter 62 is set to ¼ of the sampling frequency fs. This is because the phase is 0 at a quarter frequency (normalized frequency is 0.25) of the sampling frequency fs.

The output signal Sf(t) of the digital bandpass filter 62 is given by an equation 11.

$$Sf(t) = n \cdot \cos((\omega_a - \omega_o) \cdot t + \gamma) \quad (11)$$

where $\gamma$ is an unknown constant phase. If the gain is 1, $\omega_a$ and $\omega_o$ in the equation 11 can be rewritten as follows.

$$\omega_a - \omega_o = \omega_c + \delta \quad (12)$$

where $\delta$ is an error in the local oscillator signal Lo. Then, the equation 11 can be rewritten as the following equation 13.

$$Sf(t) = n \cdot \cos((\omega_c + \delta) \cdot t + \gamma) \quad (13)$$

Given that the reference frequency of the FM digital detector 65 is fc, the output signal Sfm(t) of the FM digital detector 65 becomes $\delta$.

The level converter 68 converts the output signal $\delta$ of the FM digital detector 65 to the frequency error $\Delta f$ of the digital oscillator 51, which in turn controls the frequency of the local oscillator signal Lo in such a manner that this frequency error $\Delta f$ becomes 0 or the error $\delta$ becomes 0.

When the frequency of the reproduced carrier signal C(t) coincides with the center frequency fc of the digital bandpass filter 62, the phase is 0 so that $\delta$ becomes 0 and $\gamma$ becomes $\theta$. Accordingly, the carrier signal is fully reproduced.

Figure 3:
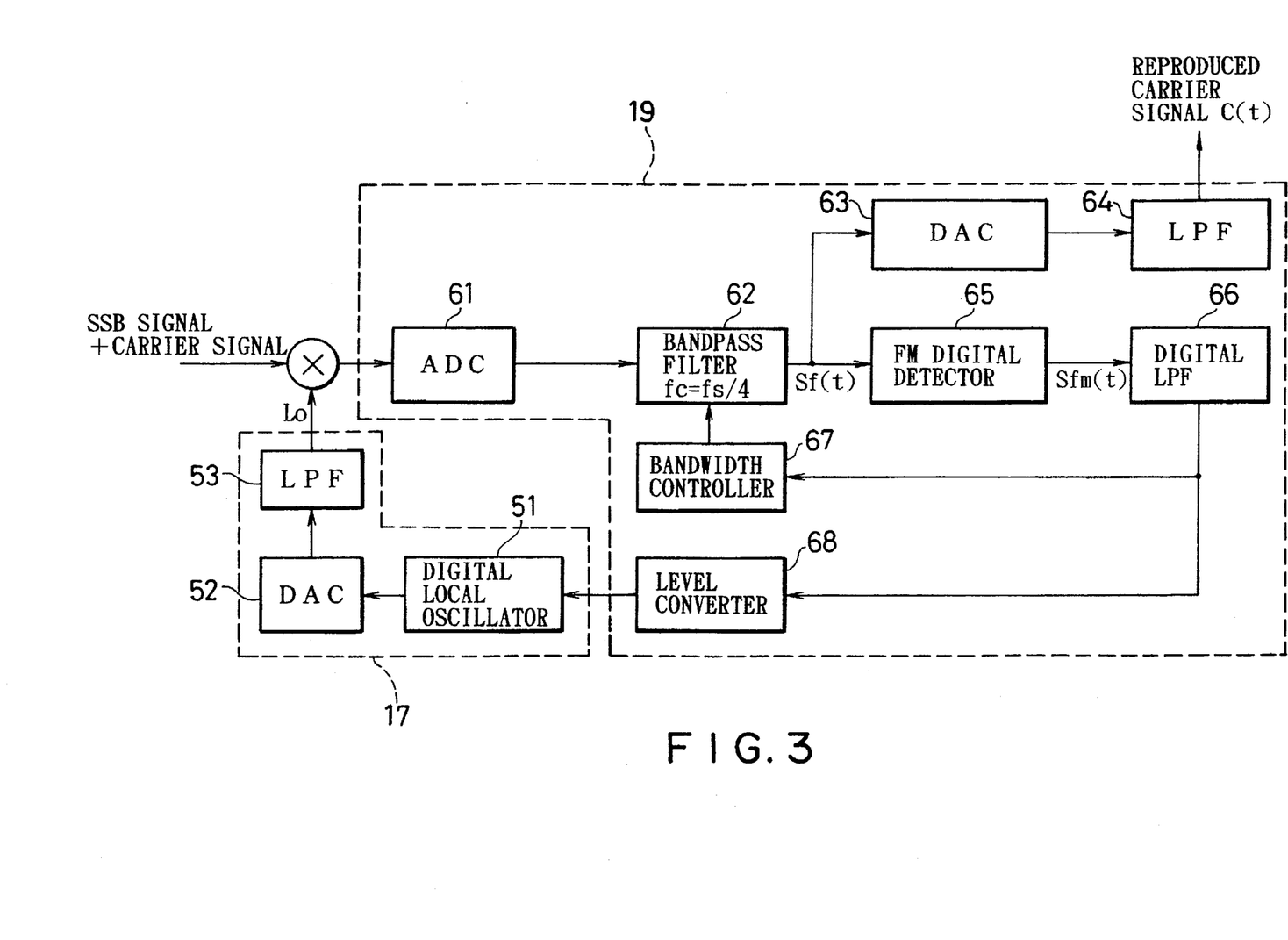
FIG. 3 is a circuit block diagram showing another example of the structure of the carrier signal reproducing circuit in FIG. 1.

The structure of the carrier signal reproducing circuit 19 is not limited to the structures shown in FIGS. 2 and 3, but any applicable structure may be employed.

Assume that the target signal g(t) has two single tones at 750 Hz and 1000 Hz, the modulation index is 0.8, the sampling frequency is 62500 Hz and the frequency of the carrier signal is 15625 Hz.

Figure 6:
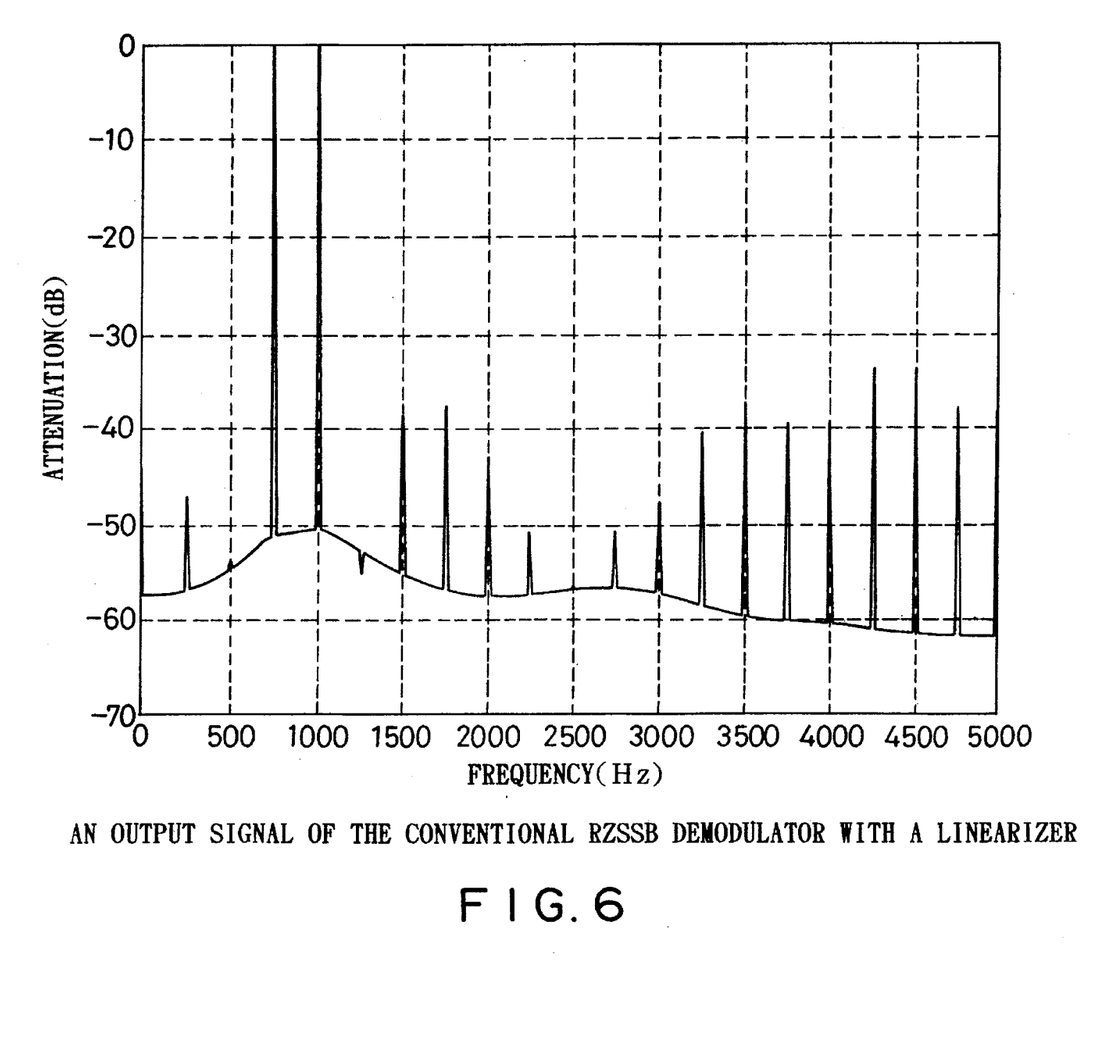
FIG. 6 is a diagram showing one example of the frequency characteristics of a demodulated signal from the conventional demodulator when a target signal g(t) has two single tones at 750 Hz and 1000 Hz, a modulation index is 0.8, a sampling frequency is 62500 Hz and the frequency of a carrier signal is 15625 Hz.

FIG. 6 shows the demodulation characteristics in this case with the conventional FM demodulator and linearizer shown in FIGS. 4 and 5. A 32-order IIR Hilbert transform circuit designed based on the Remez algorithm is used as the Hilbert transform circuit.

Figure 7:
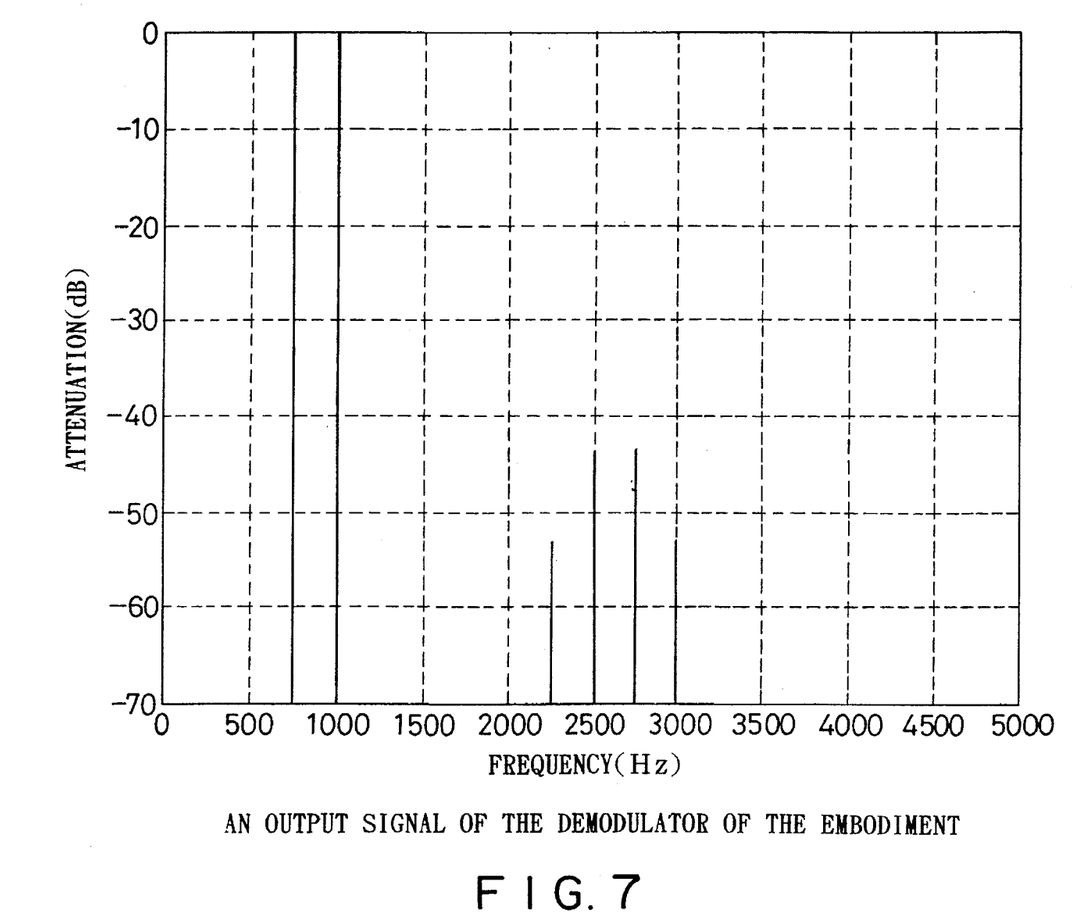
FIG. 7 is a diagram showing one example of the frequency characteristics of a demodulated signal from the demodulator of this embodiment when the target signal g(t) has two single tones at 750 Hz and 1000 Hz, the modulation index is 0.8, the sampling frequency is 62500 Hz and the frequency of the carrier signal is 15625 Hz.

FIG. 7 shows the demodulation characteristics of the demodulator shown in FIG. 1 with K=6.

As apparent from FIGS. 6 and 7, the demodulator of this embodiment can obtain a demodulated signal of a higher quality.

Figure 8:
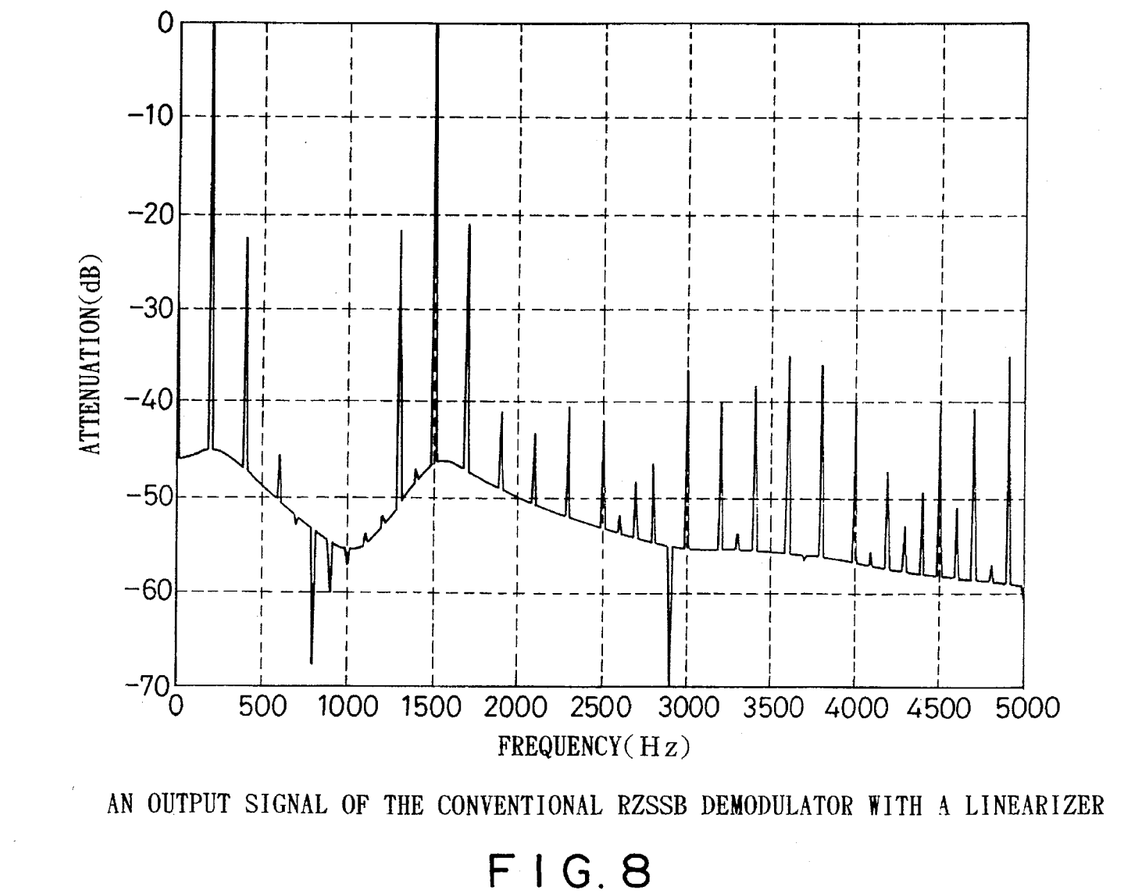
FIG. 8 is a diagram showing one example of the frequency characteristics of a demodulated signal from the conventional demodulator when the target signal g(t) has two single tones at 200 Hz and 2500 Hz, the modulation index is 0.8, the sampling frequency is 62500 Hz and the frequency of the carrier signal is 15625 Hz.
Figure 9:
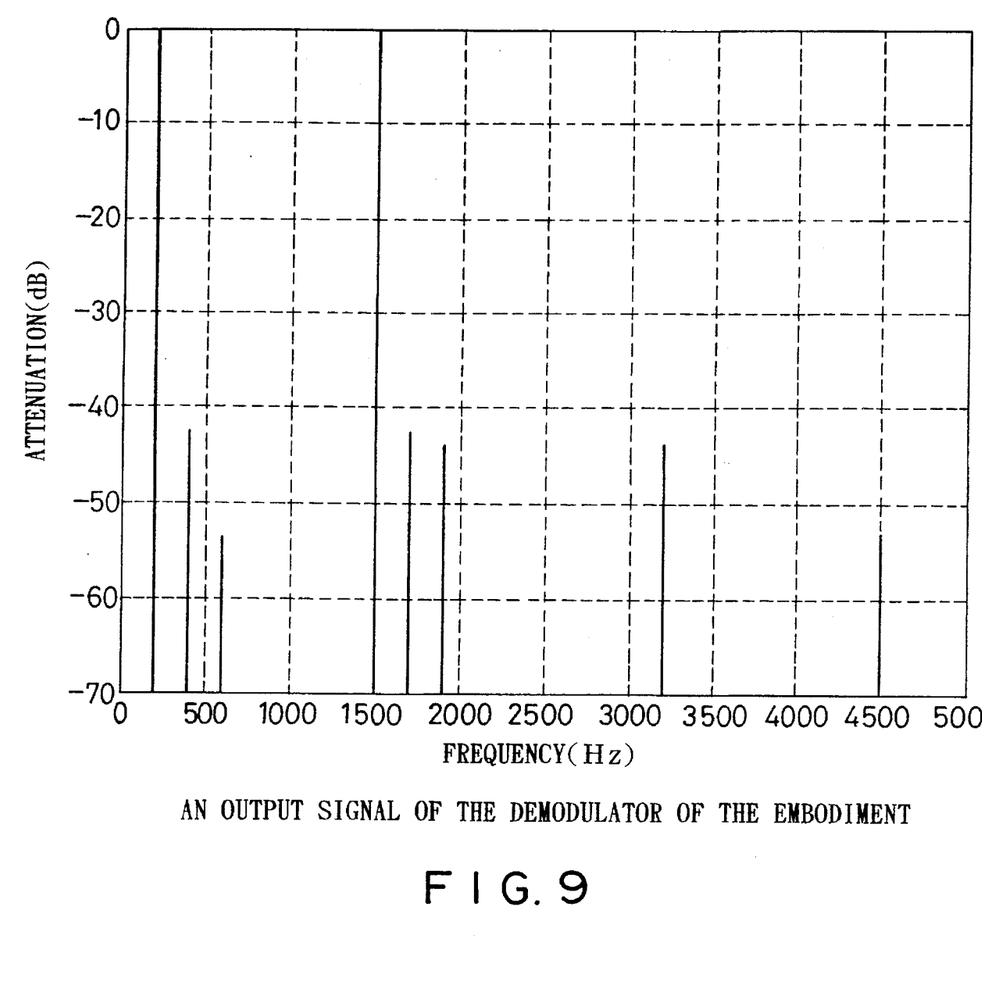
FIG. 9 is a diagram showing one example of the frequency characteristics of a demodulated signal from the demodulator of this embodiment when the target signal g(t) has two single tones at 200 Hz and 2500 Hz, the modulation index is 0.8, the sampling frequency is 62500 Hz and the frequency of the carrier signal is 15625 Hz.

FIGS. 8 and 9 respectively show the characteristics of the demodulated signals obtained by the conventional RZSSB demodulator and the demodulator of this embodiment when the target signal g(t) has two single tones at 200 Hz and 2500 Hz.

It is apparent from the characteristics in FIGS. 6 and 7 and those in FIGS. 8 and 9 that the demodulator of this embodiment can obtain a high-quality demodulated signal with less distortion than the conventional demodulator.

The present invention is not limited to the above-described embodiment, but may be modified in various other forms. The circuit of this embodiment is designed in such a manner that the subtracter 23 subtracts the intermediate frequency signal S(t) from the second reproduced carrier signal C2(t), and the subtracter 33 obtains the difference between the output signal D1(t) of the first FM demodulator 29 and the output signal D2(t) of the second FM demodulator 31. But, the circuit may be modified so that the subtracter 23 subtracts the second reproduced carrier signal C2(t) from the intermediate frequency signal S(t), and the subtracter 33 obtains the sum of the output signal D1(t) of the first FM demodulator 29 and the output signal D2(t) of the second FM demodulator 31 and outputs the obtained signal as the demodulated signal D(t).

Although the first and second FM demodulators 29 and 31 are employed, they may be accomplished by a single FM demodulator which demodulates two input signals in a time-sharing fashion.

Although the center frequency fc of the bandpass filter 62 is set to a quarter of the sampling frequency fs in FIG. 3, it is in no way limited to this particular frequency.

As apparent from the foregoing description, the demodulator of this invention, even with a simple structure, can demodulate an RZSSB signal with less distortion. Further, this demodulator can demodulate various SSB signals and an FM signal.

Furthermore, the carrier signal reproducing circuit of this invention can reproduce the carrier signal from the received signal at high precision, and can be adapted for use in the demodulator of this invention or other circuits as well.

What is claimed is:

1. A demodulator comprising:
   a receiver circuit for receiving a radio signal;
   a carrier signal reproducing circuit for reproducing a carrier signal from the received signal of said receiver circuit;
   a first amplifier for amplifying said carrier signal, reproduced by said carrier signal reproducing circuit, by a first value to produce a first reproduced carrier signal;
   a second amplifier for amplifying said carrier signal, reproduced by said carrier signal reproducing circuit, by a second value to produce a second reproduced carrier signal;
   an adder for adding said first reproduced carrier signal and said received signal from said receiver circuit;
   a subtracter for obtaining a difference between said second reproduced carrier signal and said received signal from said receiver circuit;
   a first FM demodulator for demodulating an output signal of said adder;
   a second FM demodulator for demodulating an output signal of said subtracter; and
   an arithmetic operation circuit for performing an operation on an output signal of said first FM demodulator and an output signal of said second FM demodulator to produce a demodulated signal of said received signal, and outputting said demodulated signal.

2. The demodulator according to claim 1, wherein said first value is $20\log_{10}(K)$ dB, and said second value is $20\log_{10}(K+2)$ dB, where K is a positive integer.

3. The demodulator according to claim 1, wherein said receiver circuit comprises an antenna, a local oscillator and a mixer for mixing a signal from said antenna and an output signal of said local oscillator.

4. The demodulator according to claim 3, wherein said carrier signal reproducing circuit comprises:
   a bandpass filter for outputting a component of a predetermined frequency of an output signal of said mixer, as a reproduced carrier signal;
   an FM detector for performing FM detection on an output signal of said bandpass filter; and
   a frequency controller for controlling a frequency of a local oscillator signal from said local oscillator in accordance with an output of said FM detector.

5. The demodulator according to claim 3, wherein said carrier signal reproducing circuit comprises:
   an analog-to-digital converter for sampling an output signal of said mixer at a predetermined sampling frequency to convert said output signal to a digital signal;
   a bandpass digital filter for filtering an output signal of said analog-to-digital converter;
   means for converting an output signal of said bandpass digital filter to an analog signal and outputting said analog signal as a reproduced carrier signal;
   an FM detector for performing FM detection on said output signal of said bandpass digital filter; and
   a frequency controller for controlling a frequency of a local oscillator signal output from said local oscillator in accordance with an output of said FM detector.

6. The demodulator according to claim 1, wherein said subtracter comprises a circuit for subtracting said received signal of said receiver circuit from said second reproduced carrier signal; and
   said arithmetic operation circuit comprises a subtracter for obtaining a difference between said output signal of said first FM demodulator and said output signal of said second FM demodulator.

7. The demodulator according to claim 1, wherein said subtracter comprises a circuit for subtracting said second reproduced carrier signal from said received signal of said receiver circuit; and
   said arithmetic operation circuit comprises an adder for obtaining a sum of said output signal of said first FM demodulator and said output signal of said second FM demodulator.

8. The demodulator according to claim 2, wherein said receiver circuit comprises an antenna, a local oscillator and a mixer for mixing a signal from said antenna and an output signal of said local oscillator.

9. The demodulator according to claim 2, wherein said subtracter comprises a circuit for subtracting said received signal of said receiver circuit from said second reproduced carrier signal; and
   said arithmetic operation circuit comprises a subtracter for obtaining a difference between said output signal of said first FM demodulator and said output signal of said second FM demodulator.

10. The demodulator according to claim 3, wherein said subtracter comprises a circuit for subtracting said received signal of said receiver circuit from said second reproduced carrier signal; and
    said arithmetic operation circuit comprises a subtracter for obtaining a difference between said output signal of said first FM demodulator and said output signal of said second FM demodulator.

11. The demodulator according to claim 4, wherein said subtracter comprises a circuit for subtracting said received signal of said receiver circuit from said second reproduced carrier signal; and
    said arithmetic operation circuit comprises a subtracter for obtaining a difference between said output signal of said first FM demodulator and said output signal of said second FM demodulator.

12. The demodulator according to claim 5, wherein said subtracter comprises a circuit for subtracting said received signal of said receiver circuit from said second reproduced carrier signal; and
    said arithmetic operation circuit comprises a subtracter for obtaining a difference between said output signal of said first FM demodulator and said output signal of said second FM demodulator.

13. The demodulator according to claim 8, wherein said subtracter comprises a circuit for subtracting said received signal of said receiver circuit from said second reproduced carrier signal; and
    said arithmetic operation circuit comprises a subtracter for obtaining a difference between said output signal of said first FM demodulator and said output signal of said second FM demodulator.

14. The demodulator according to claim 2, wherein said subtracter comprises a circuit for subtracting said second reproduced carrier signal from said received signal of said receiver circuit; and
    said arithmetic operation circuit comprises an adder for obtaining a sum of said output signal of said first FM demodulator and said output signal of said second FM demodulator.

15. The demodulator according to claim 3, wherein said subtracter comprises a circuit for subtracting said second reproduced carrier signal from said received signal of said receiver circuit; and said arithmetic operation circuit comprises an adder for obtaining a sum of said output signal of said first FM demodulator and said output signal of said second FM demodulator.

16. The demodulator according to claim 4, wherein said subtracter comprises a circuit for subtracting said second reproduced carrier signal from received signal of said receiver circuit; and said arithmetic operation circuit comprises an adder for obtaining a sum of said output signal of said first FM demodulator and said output signal of said second FM demodulator.

17. The demodulator according to claim 5, wherein said subtracter comprises a circuit for subtracting said second reproduced carrier signal from said received signal of said receiver circuit; and said arithmetic operation circuit comprises an adder for obtaining a sum of said output signal of said first FM demodulator and said output signal of said second FM demodulator.

18. The demodulator according to claim 8, wherein said subtracter comprises a circuit for subtracting said second reproduced carrier signal from said received signal of said receiver circuit; and said arithmetic operation circuit comprises an adder for obtaining a sum of said output signal of said first FM demodulator and said output signal of said second FM demodulator.

19. The demodulator according to claim 8, wherein said carrier signal reproducing circuit comprises:

a bandpass filter for outputting a component of a predetermined frequency of an output signal of said mixer, as a reproduced carrier signal;

an FM detector for performing FM detection on an output signal of said bandpass filter; and a frequency controller for controlling a frequency of a local oscillator signal from said local oscillator in accordance with an output of said FM detector.

20. The demodulator according to claim 8, wherein said carrier signal reproducing circuit comprises:

an analog-to-digital converter for sampling the received signal mixed with a local oscillator signal as the output signal from the local oscillator at a predetermined sampling frequency and outputting a digital intermediate frequency signal;

a bandpass digital filter for filtering the digital intermediate frequency signal and outputting a component of a predetermined frequency as a digital reproduced carrier signal, a center frequency of said bandpass digital filter being set to ¼ of the sampling frequency;

means for converting the digital reproduced carrier signal to an analog signal and outputting the analog signal as the reproduced carrier signal;

an FM detector for performing FM detection on the digital reproduced carrier signal and outputting an FM detected signal as an error signal; and a frequency controller for controlling a frequency of said local oscillator signal to make said error signal tend to go to zero.

21. The demodulator according to claim 19, wherein said subtracter comprises a circuit for subtracting said received signal of said receiver circuit from said second reproduced carrier signal; and said arithmetic operation circuit comprises a subtracter for obtaining a difference between said output signal of said first FM demodulator and said output signal of said second FM demodulator.

22. The demodulator according to claim 19, wherein said subtracter comprises a circuit for subtracting said second reproduced carrier signal from the received signal of said receiver circuit; and said arithmetic operation circuit comprises an adder for obtaining a sum of said output signal of said first FM demodulator and said output signal of said second FM demodulator.

23. A demodulator comprising:

an adder for adding a reproduced carrier signal having an amplitude multiplied by K and an SSB signal having a carrier signal;

a subtracter for obtaining a difference between a reproduced carrier signal having an amplitude multiplied by (K+2) and said SSB signal having said carrier signal;

a first FM demodulator for demodulating an output signal of said adder;

a second FM demodulator for demodulating an output signal of said subtracter; and an arithmetic operation circuit for performing an operation on an output signal of said first FM demodulator and an output signal of said second FM demodulator to produce a demodulated signal of said SSB signal, and outputting said demodulated signal.

24. A carrier signal reproducing circuit comprising:

an analog-to-digital converter for sampling a received signal mixed with a local oscillator signal from a local oscillator at a predetermined sampling frequency and outputting a digital intermediate frequency signal;

a bandpass digital filter for filtering the digital intermediate frequency signal and outputting a component of a predetermined frequency as a digital reproduced carrier signal, a center frequency of said bandpass digital filter being set to ¼ of the sampling frequency;

means for converting the digital reproduced carrier signal to an analog signal;

an FM detector for performing FM detection on the digital reproduced carrier signal and outputting an FM-detected signal as an error signal; and a frequency controller for controlling a frequency of said local oscillator signal to make said error signal tend to go substantially to zero.

25. The carrier signal reproducing circuit according to claim 24, wherein said frequency controller comprises:

a digital low-pass filter for cutting a high-frequency component of said output signal of said FM detector; and a level converter for converting the output signal of said digital low-pass filter to a frequency error signal of said local oscillator, and outputting said frequency error signal.

26. The carrier signal reproducing circuit according to claim 24, wherein said local oscillator comprises:

a digital oscillator for outputting a digital oscillation signal in accordance with said error signal;

a digital-to-analog convertor for converting an output signal of said digital oscillator to an analog oscillation signal; and an analog low-pass filter for cutting a high-frequency component of the analog oscillation signal.

27. A carrier signal reproducing circuit comprising:

a mixer for mixing a received signal with a local oscillator signal and outputting a mixed signal;

a bandpass filter for filtering the mixed signal and outputting a component of a predetermined frequency as a reproduced carrier signal, a zero phase point of said bandpass filter being set to the center frequency of passband of said bandpass filter;

an FM detector for performing FM detection on the reproduced signal and outputting an FM-detected signal as an error signal; and a frequency controller for controlling a frequency of said local oscillator signal to make said error signal go substantially to zero.

* * * * *